(12) United States Patent
Yang

(10) Patent No.: US 7,388,403 B1
(45) Date of Patent: Jun. 17, 2008

(54) TWO-STAGE LEVEL SHIFTING MODULE

(75) Inventor: Tsai-Ming Yang, Tainan County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/751,041

(22) Filed: May 21, 2007

(51) Int. Cl.
*H03K 19/0175* (2006.01)
(52) U.S. Cl. .............................. 326/68; 326/81; 326/82
(58) Field of Classification Search .................. 326/63, 326/68–74, 80–83
See application file for complete search history.

(56) References Cited

U.S. PATENT DOCUMENTS 6,060,904 A 5/2000 Shimoda
6,838,924 B1 * 1/2005 Davies, Jr. ................... 327/333
2003/0231045 A1 12/2003 Lundberg

* cited by examiner

*Primary Examiner*—Don P Le
(74) *Attorney, Agent, or Firm*—Winston Hsu

(57) ABSTRACT

For raising low voltage levels of a voltage range without over-broadening the voltage range, a first stage voltage level shifting circuit, which is capable of raising an upper bound of its input voltage range, is coupled to a second voltage level shifting circuit, which is capable of raising both an upper bound and a lower bound of its input voltage range. Therefore, a two-stage voltage level shifting module, which is generated by coupling the first voltage level shifting circuit to the second voltage level shifting circuit, is capable of providing appropriate voltages for external I/O devices having different biasing voltage ranges, where an upper bound and a lower bound of each of the provided biasing voltage ranges precisely indicates a digital logic 0 or a digital logic 1 indicated by a digital signal.

9 Claims, 2 Drawing Sheets

TWO-STAGE LEVEL SHIFTING MODULE

BACKGROUND OF THE INVENTION

1. Field of the Invention

The present invention provides a voltage level shifting module, and more particularly, a two-stage voltage level shifting module utilized on a plurality of I/O devices having different bias voltages.

2. Description of the Prior Art

With the growth of integrated circuits and in the fabrication procedure of the integrated circuits, the areas and volumes of the integrated circuits are decreased. Therefore, a bias voltage applied on an integrated circuit is decreased in accordance to the decreased volume of the integrated circuit. Under such a circumstance, it is more popular to drive and connect an integrated circuit having a lower bias voltage with external devices having higher bias voltages. However, the external devices are not decreased in their bias voltages with the evolvement of the integrated circuit, or are not able to follow the velocity of decreasing the bias voltage of the integrated circuit. External devices of this kind include conventional Input/Output (I/O) devices. As mentioned above, it cannot be smoothly operated in directly driving and connecting an integrated circuit having a lower bias voltage with external devices having higher bias voltages. For neutralizing such drawbacks, a voltage level shifting circuit is further added on the integrated circuit in the prior art for raising the lower bias voltage of the integrated circuit to match the external devices having the higher bias voltages.

However, new problems arise along with the added voltage level shifting circuit. First, because of the continuously decreased volume of an integrated circuit in related fabrication procedure, thicknesses of metal oxide semiconductor field-effect transistors (MOSFET) are decreased so that upper bounds of the voltage levels at the gates of the MOSFETs are gradually decreased as well, whereas a voltage level, which is at the gate of a MOSFET and is higher than the upper bound, leads to the gate oxide breakdown of the MOSFET. Moreover, the abovementioned voltage level shifting circuit just raises an upper bound of a bias voltage range of the integrated circuit in fact, whereas the lower bound of the bias voltage range is kept. In other words, merely a voltage level indicating the digital logic 1 is raised, whereas a voltage level indicating the digital logic 0 is kept. For example, a bias voltage range of an integrated circuit is assumed to be raised from 0-1.8 volts to 0-3.3 volts, where the voltage level indicating the digital logic 1 is raised from 1.8 volts to 3.3 volts for matching bias voltages of external devices, and the voltage level indicating the digital logic 0 is 0 volts. However, when the bias voltage range of the integrated circuit is broadened, a voltage difference between voltage levels of a gate and a source of each MOSFET of the integrated circuit easily leads to the gate oxide breakdown of each MOSFET, and brings permanent damage to each MOSFET as well. It can be observed that the method of adding a voltage level shifting circuit inside an integrated circuit in the prior art has to be improved. For a MOSFET under the 0.18 µm fabrication procedure, a voltage difference of 3.3 volts easily leads to the gate oxide breakdown.

Please refer to FIG. 1, which is a diagram of a voltage level shifting circuit 100 capable of increasing an upper bound of a bias voltage range in the prior art. As shown in FIG. 1, the voltage level shifting circuit 100 includes an invert logical operational amplifier 102, a first N-type MOSFET 104, a second N-type MOSFET 106, a third N-type MOSFET 108, a fourth N-type MOSFET 110, a first P-type MOSFET 112, and a second P-type MOSFET 114. The invert logic operational amplifier 102 has a positive bias terminal coupled to a voltage source VDD1, and a negative bias terminal coupled to ground, an input terminal coupled to a signal source Input. A voltage level of the signal source Input is between the voltage levels of the voltage source VDD1 and ground. The first N-type MOSFET 104 has a gate coupled to an output terminal of the invert logic operational amplifier 102, and a source coupled to ground. The second N-type MOSFET 106 has a gate coupled to the signal source Input, and a source coupled to ground. The third N-type MOSFET 108 has a source coupled to a drain of the first N-type MOSFET 104, and a gate coupled to a voltage source VDD2. A voltage level of the voltage source VDD2 is higher than the voltage level of the voltage source VDD1. The fourth N-type MOSFET 110 has a source coupled to a drain of the second N-type MOSFET 106, and a gate coupled to the gate of the third N-type MOSFET 108. The first P-type MOSFET 112 has a drain coupled to a drain of the third N-type MOSFET 108, a gate coupled to a drain of the fourth N-type MOSFET 110, and a source coupled to a voltage source VDDIO. A voltage level of the voltage source VDDIO is higher than the voltage level of the voltage source VDD2. The second P-type MOSFET 114 has a drain coupled to the drain of the fourth N-type MOSFET 110, a gate coupled to the drain of the third N-type MOSFET 108, and a source coupled to the voltage source VDDIO.

The voltage level shifting circuit 100 is primarily utilized for broadening the voltage range of the signal source Input by raising an upper bound of said voltage range. While describing operations of the voltage level shifting circuit 100 in FIG. 1, the following assumptions are made and include (a) the voltage level of the voltage source VDD1 is 1.0 volts, (b) the voltage level of the voltage source VDD2 is 2.5 volts, (c) the voltage level of the voltage source VDDIO is 3.3 volts, and (d) the voltage range of the signal source Input is between 0 and 1.0 volts for indicating digital logic 0 and 1 respectively. The invert logic operational amplifier 102 is biased between ground (with 0 volts) and the voltage source VDD1 so that a voltage level of an output voltage of the invert logic operational amplifier 102 may be fully raised to 1.0 volts or fully decreased to 0 volts. The invert logic operational amplifier 102 may be implemented by coupling a conventional operational amplifier to an inverter so that a voltage having a high voltage level may be fully transformed into another voltage having a low voltage level, and vice versa, where it is a conventional method of clearly differentiating a low voltage level from a high voltage level and is not be discussed further. Operations of the voltage level shifting circuit 100 are described as follows. When a signal of the signal source Input indicates the digital logic 1, a voltage level at the gate of the first N-type MOSFET 104 is low, a voltage level at the gate of the second N-type MOSFET 106 is high. Therefore, the first N-type MOSFET 104 is switched off whereas the second N-type MOSFET is switched on. Since the voltage source VDD2 is coupled to both the gates of the third N-type MOSFET 108 and the fourth N-type MOSFET 110, both the third N-type MOSFET 108 and the fourth N-type MOSFET 110 are continuously switched on, and moreover, with the biasing of the voltage source VDD2, voltage levels at the drains of both the third N-type MOSFET 108 and the fourth N-type MOSFET 110 are raised for achieving broadening the voltage range as a purpose at a first level. At the same time, since the first N-type MOSFET 104 is switched off, no current flows through both the first N-type MOSFET 104 and the third N-type MOSFET 108, and a voltage level at the drain of the first P-type MOSFET 112, i.e., the node A+ shown in FIG. 1, is slightly lower than the voltage level of the voltage source VDDIO. Similarly, since the second N-type MOSFET 106 is switched on, there is a current flowing through both the second N-type MOSFET 106 and the fourth N-type MOSFET 110, and a voltage level at the drain of the second P-type MOSFET 114, i.e., the node B+ shown in FIG. 1, is significantly decreased. Note that both output terminals of the voltage level shifting circuit 100 lie at the nodes A+ and B+, and in other words, a voltage difference between the nodes A+ and B+ just indicates the output voltage range of the voltage level shifting circuit 100. Moreover, by biasing of the voltage source VDDIO coupled to sources of both the first P-type MOSFET 112 and the second P-type MOSFET 114, a voltage range, which is previously between voltage levels of ground and the voltage source VDD1, is broadened to be between voltage levels of ground and the voltage source VDDIO. Under the above-made assumptions, the voltage range is broadened from 0-1.0 volts to 0-3.3 volts. However, concerning the gate oxide breakdown, when one of the first P-type MOSFET 112 and the second P-type MOSFET 114 has a source voltage level equal to 3.3 volts and a gate voltage level equal to 0 volts, i.e., when a voltage difference equal to 3.3 volts is generated, the gate oxide breakdown is likely to happen so that permanent damage occurred on the P-type MOSFET, and voltage levels at both the nodes A+ and B+ cannot clearly tell digital logic 0 and digital logic 1.

In the prior art, a method of coupling two same voltage level shifting circuits is also provided for providing a safer and broader voltage range. However, in such a method, since an amount of utilized masks in the integrated circuit must be increased to be at least twice, the capital of fabricating the integrated circuit is increased, and the volume of the integrated circuit is significantly increased as well.

SUMMARY OF THE INVENTION

The claimed invention discloses a two-stage voltage level shifting module for a plurality of I/O devices having different bias voltages. The two-stage voltage level shifting module comprises a first stage voltage level shifting circuit, a first voltage source, a second voltage, a third voltage source, a first P-type MOSFET, a second P-type MOSFET, and a second stage voltage level shifting circuit. The first voltage source is coupled to a first voltage input terminal of the first stage voltage level shifting circuit. The second voltage source has a voltage level higher than the voltage level of the first voltage source, and is coupled to a second voltage input terminal of the first stage voltage level shifting circuit. The third voltage source has a voltage level higher than the voltage levels of both the first voltage source and the second voltage source. The first P-type MOSFET has a source coupled to the third voltage source. The second P-type MOSFET has a source coupled to the third voltage source, a drain coupled to a gate of the first P-type MOSFET, and a gate coupled to a drain of the first P-type MOSFET. The second stage voltage level shifting circuit comprises a third P-type MOSFET, a fourth P-type MOSFET, a fifth P-type MOSFET, a sixth P-type MOSFET, a first N-type MOSFET, a second N-type MOSFET, a seventh P-type MOSFET, and an eighth P-type MOSFET. The third P-type MOSFET has a source coupled to the drain of the first P-type MOSFET. The fourth P-type MOSFET has a source coupled to the drain of the second P-type MOSFET. The fifth P-type MOSFET has a gate coupled to the drain of the third P-type MOSFET, a source coupled to the gate of the second P-type MOSFET, and a drain coupled to the first voltage source. The sixth P-type MOSFET has a gate coupled to the drain of the fourth P-type MOSFET, a source coupled to the gate of the first P-type MOSFET, and a drain coupled to the first voltage source. The first N-type MOSFET has a source coupled to the drain of the fifth P-type MOSFET, a gate coupled to a first signal output terminal of the first stage voltage level shifting circuit, and a drain coupled to the gate of the third P-type MOSFET. The second N-type MOSFET has a source coupled to the drain of the sixth P-type MOSFET, a gate coupled to a second signal output terminal of the first stage voltage shifting circuit, and a drain coupled to the gate of the fourth P-type MOSFET. The seventh P-type MOSFET has a gate coupled to the gate of the first N-type MOSFET, a drain coupled to the drain of the first N-type MOSFET, and a source coupled to the second voltage source. The eighth P-type MOSFET has a gate coupled to the second N-type MOSFET, a drain coupled to the drain of the second N-type MOSFET, and a source coupled to the second voltage source.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
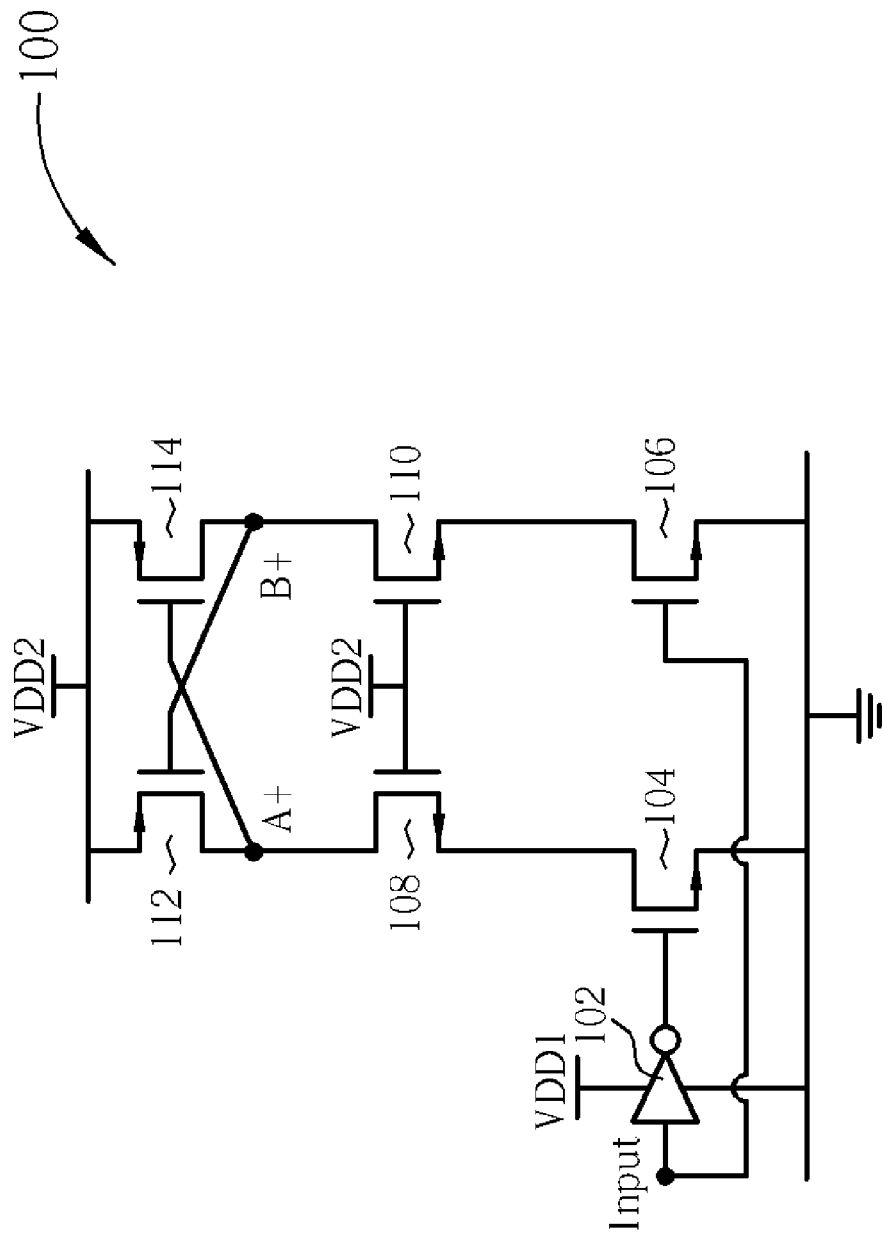
FIG. 1 is a diagram of a voltage level shifting circuit capable of increasing an upper bound of a bias voltage range in the prior art.

Therefore, a two-stage voltage level shifting module is provided in the present invention for solving the problem that gate oxide breakdown of MOSFETs is generated from an over-broadening voltage range. The technique utilized in the two-stage voltage level shifting module of the present invention lies in further adding a voltage level shifting circuit having fewer masks to the voltage level shifting circuit, which is shown in FIG. 1 and is capable of raising the upper bound of the voltage range, for raising the lower bound of the voltage range, and for preventing the gate oxide breakdown generated by the over-broadening voltage range. Note that the voltage level shifting circuit shown in FIG. 1 of the prior art may be regarded as a first stage voltage level shifting circuit, and the further-added voltage level shifting circuit may be regarded as a second stage voltage level shifting circuit as well.

Figure 2:
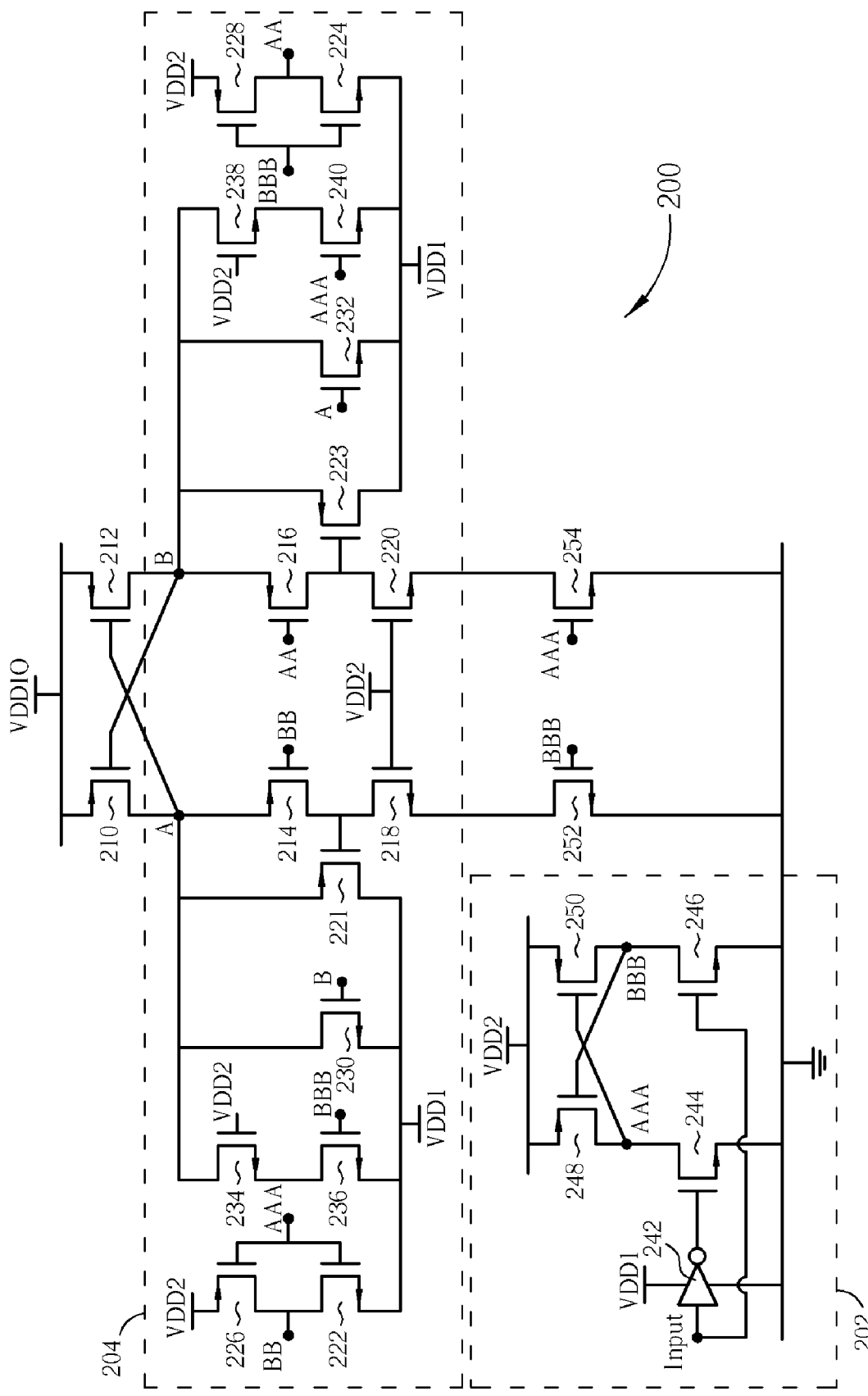
FIG. 2 is a diagram of a two-stage voltage level shifting module disclosed in the present invention.

Please refer to FIG. 2, which is a diagram of a two-stage voltage level shifting module 200 disclosed in the present invention. The two-stage voltage level shifting module 200 includes a first stage voltage level shifting circuit 202 and a second stage voltage level shifting circuit 204. Note that in FIG. 2, some couplings of the two-stage voltage level shifting module 200 are shown as discrete nodes having same symbols for preventing the over-interleaving couplings from confusing anyone reading FIG. 2. For example, all nodes denoted as AAA are coupled to each other so that voltage levels of all the nodes AAA are the same. This applies to nodes A, B, AA, BB, and BBB as well. The first stage voltage level shifting circuit 202 has a similar circuitry with the voltage level shifting circuit 100 shown in FIG. 1, however, there are still a few discrepancies between the first stage voltage level shifting circuit 202 and the voltage level shifting circuit 100. Details about the first stage voltage level shifting circuit 202 are going to be described later.

In the two-stage voltage level shifting module 200, the first P-type MOSFET has a source coupled to the voltage source VDDIO. The second P-type MOSFET 212 has a source coupled to the voltage source VDDIO, a drain coupled to the gate of the first P-type MOSFET 210, and a gate coupled to the drain of the first P-type MOSFET 210.

The second voltage level shifting circuit 204 includes a third P-type MOSFET 214, a fourth P-type MOSFET 216, a ninth N-type MOSFET 218, a tenth N-type MOSFET 220, a fifth P-type MOSFET 221, a sixth P-type MOSFET 223, a first N-type MOSFET 222, a second N-type MOSFET 224, a seventh P-type MOSFET 226, an eighth P-type MOSFET 228, a third N-type MOSFET 230, a fourth N-type MOSFET 232, a fifth N-type MOSFET 234, a sixth N-type MOSFET 236, a seventh N-type MOSFET 238, an eighth N-type MOSFET 240. The third P-type MOSFET 214 has a source coupled to a drain of the first P-type MOSFET 210. The fourth P-type MOSFET 216 has a source coupled to a drain of the second P-type MOSFET 212. The fifth P-type MOSFET 221 has a gate coupled to a drain of the third P-type MOSFET 214, a source coupled to the gate of the second P-type MOSFET 212, and a drain coupled to the voltage source VDD1. The sixth P-type MOSFET 223 has a gate coupled to a drain of the fourth P-type MOSFET 216, a source coupled to the gate of the first P-type MOSFET 210, and a drain coupled to the voltage source VDD1. The ninth N-type MOSFET 218 has a drain coupled to the drain of the third P-type MOSFET 214, and a gate coupled to the voltage source VDD2. The tenth N-type MOSFET 220 has a drain coupled to the drain of the fourth P-type MOSFET 216, and a gate coupled to the gate of the ninth N-type MOSFET 218. The first N-type MOSFET 222 has a source coupled to the drain of the fifth P-type MOSFET 221, a gate coupled to a first signal output terminal of the first stage voltage level shifting circuit 202 through the node AAA, and a drain coupled to the gate of the third P-type MOSFET 214 through the node BB. The second N-type MOSFET 224 has a source coupled to the drain of the sixth P-type MOSFET 223, a gate coupled a second signal output terminal of the first stage voltage level shifting circuit 202 through the node BBB, and a drain coupled to the gate of the fourth P-type MOSFET 216 through the node AA. The seventh P-type MOSFET 226 has a gate coupled to the gate of the first N-type MOSFET 222, a drain coupled to the drain of the first N-type MOSFET 222, and a source coupled to the voltage source VDD2. The eighth P-type MOSFET 228 has a gate coupled to the gate of the second N-type MOSFET 224, a drain coupled to the drain of the second N-type MOSFET 224, and a source coupled to the voltage source VDD2. The third N-type MOSFET 230 has a gate coupled to the drain of the second P-type MOSFET 212 through the node B, a source coupled to the drain of the fifth P-type MOSFET 221, and a drain coupled to the gate of the second P-type MOSFET 212. The fourth N-type MOSFET 232 has a gate coupled to the drain of the first P-type MOSFET 210 through the node A, a source coupled to the drain of the sixth P-type MOSFET 223, and a drain coupled to the gate of the first P-type MOSFET 210. The fifth N-type MOSFET 234 has a gate coupled to the voltage source VDD2, and a drain coupled to the gate of the second P-type MOSFET 212. The sixth N-type MOSFET 236 has a drain coupled to a source of the fifth N-type MOSFET 234, a gate coupled to the second signal output terminal of the first stage voltage level shifting circuit 202 through the node BBB, and a source coupled to the drain of the fifth P-type MOSFET 221. The seventh N-type MOSFET 238 has a drain coupled to the gate of the first P-type MOSFET 210, and a gate coupled to the voltage source VDD2. The eighth N-type MOSFET 240 has a drain coupled to a source of the seventh N-type MOSFET 238, a gate coupled to the first signal output terminal of the first stage voltage level shifting circuit 202 through the node AAA, and a source coupled to the drain of the sixth P-type MOSFET 220. Note that both the nodes A and B are signal output terminals of the two-stage voltage level shifting module 200 for outputting digital signals generated by broadening the voltage range of the signal source Input.

The first stage voltage level shifting circuit 202 includes an invert logic operational amplifier 242, a ninth P-type MOSFET 248, a tenth P-type MOSFET 250, an eleventh N-type MOSFET 244, and a twelfth N-type MOSFET 246. The invert logic operational operator 242 has a first voltage input terminal coupled to the voltage source VDD1, and a second voltage input terminal coupled to ground so that the invert logic operational amplifier 242 is biased with a voltage range having voltage levels between ground and the voltage source VDD1. The eleventh N-type MOSFET 244 has a gate coupled to an output terminal of the invert logic operational amplifier 242, a source coupled to ground, and a drain coupled to the first signal output terminal of the first stage voltage level shifting circuit 202 though the node AAA. The twelfth N-type MOSFET 246 has a gate coupled to an input terminal of the invert logic operational amplifier 242, a source coupled to ground, and a drain coupled to the second signal output terminal of the first stage voltage level shifting circuit 202 through the node BBB. The ninth P-type MOSFET 248 has a source coupled to the voltage source VDD2, a gate coupled to the drain of the twelfth N-type MOSFET 246, and a drain coupled to the drain of the eleventh N-type MOSFET 244. The tenth P-type MOSFET 250 has a source coupled to the voltage source VDD2, a gate coupled to the drain of the eleventh N-type MOSFET 244, and a drain coupled to the drain of the twelfth N-type MOSFET 246.

The two-stage voltage level shifting module 200 further includes a thirteenth N-type MOSFET 252 and a fourteenth N-type MOSFET 254. The thirteenth N-type MOSFET 252 has a source coupled to the source of the eleventh N-type MOSFET 244, a gate coupled to the second signal output terminal of the first stage voltage level shifting circuit 202 through the node BBB, and a drain coupled to the source of the ninth N-type MOSFET 218. The fourteenth N-type MOSFET 254 has a source coupled to the source of the twelfth N-type MOSFET 246, a gate coupled to the first signal output terminal of the first stage voltage level shifting circuit 202, and a drain coupled to the source of the tenth N-type MOSFET 220.

Operations of the two-stage voltage level shifting module 200 are described as follows. When the signal source Input stays at a high voltage level, the eleventh N-type MOSFET 244 is switched off, and the twelfth N-type MOSFET 246 is switched on. Therefore, the voltage level at the node AAA is decreased slightly since there is no current flowing through the eleventh N-type MOSFET 244, i.e., the node AAA stays at a high voltage level currently. The voltage level at the node BBB is dropped significantly from the voltage level of the voltage source VDD2 because there is a current flowing through the twelfth N-type MOSFET 246, i.e., the node BBB stays at a low voltage level currently. At this time, under the biasing of the voltage source VDD2, the voltage range defined by the voltage difference between the nodes AAA and BBB is shifted from a previous voltage range of the signal source Input, which is between 0 volts and the voltage level of the voltage source VDD1, to between 0 volts and the voltage level of the voltage source VDD2. With the high voltage level at the node AAA and the low voltage level at the node BBB, the seventh P-type MOSFET 226 is switched off, the first N-type MOSFET 222 is switched on, the eighth P-type MOSFET 228 is switched on, the second N-type MOSFET 224 is switched off, the sixth N-type MOSFET 236 is switched off, the eighth N-type MOSFET 240 is switched on, the thirteen N-type MOSFET 252 is switched off, and the fourteen N-type MOSFET 254 is switched on. At this time, since the seventh P-type MOSFET 226 is switched off, and the third P-type MOSFET 222 is switched on, the voltage level at the node BB is significantly decreased to a low voltage level. Similarly, since the eighth P-type MOSFET 228 is switched on, and the second N-type MOSFET 224 is switched off, the voltage level at the node AA is kept on a high voltage level slightly lower than the voltage level of the voltage source VDD2. Because the node AA stays at the high voltage level and the node BB stays at the low voltage level, the third P-type MOSFET 214 is switched on, and the fourth P-type MOSFET 216 is switched off. However, since the thirteenth N-type MOSFET 252 is switched off and the fourteenth N-type MOSFET 254 is switched on, there is no current flowing through the thirteenth N-type MOSFET 252, whereas there is a current flowing through the fourteenth N-type MOSFET 254. Therefore, a current flowing through the third P-type MOSFET 214 is smaller, whereas a current flowing through the fourth P-type MOSFET 216 is larger. At this time, the voltage level at the drain of the third P-type MOSFET 214 is close to the voltage level at the source of the third P-type MOSFET 214, i.e., close to the voltage level of the voltage source VDDIO, so that the fifth P-type MOSFET 221 is switched off. Therefore, the voltage level at the drain of the first P-type MOSFET 210, i.e., the voltage level at the node A, is close to the voltage level of the voltage source VDDIO. Similarly, the voltage level at the drain of the fourth P-type MOSFET 216 is decreased by a flowing current of the fourth P-type MOSFET 216 so that the sixth P-type MOSFET 223 is switched on, and the voltage level at the drain of the second P-type MOSFET 212, i.e., the voltage level at the node B, is decreased. At last, the voltage level at the node A stays at a high voltage level, whereas the voltage level at the node B stays at a low voltage level. The voltage level at the node A is close to the voltage level of the voltage source VDDIO. The voltage level at the node B is slightly higher than the voltage level of the voltage source VDD1 because the voltage source VDD1 is coupled to the drain of the sixth P-type MOSFET 223.

The third N-type MOSFET 230, the fifth N-type MOSFET 234, and the sixth N-type MOSFET 236 are utilized for discharging the voltage level at the node A so that the voltage level at the node A is decreased more rapidly when the voltage level at the node A stays at a low voltage level. Similarly, the fourth N-type MOSFET 232, the seventh N-type MOSFET 238, and the eighth N-type MOSFET 240 are utilized for discharging the voltage level at the node B so that the voltage level at the node B is decreased more rapidly when the voltage level at the node B stays at a low voltage level. As mentioned above, when the signal source Input stays at a high voltage level, the third N-type MOSFET 230, the gate of which stays at a low voltage level, is switched off, and the sixth N-type MOSFET 236, the gate of which stays at a low voltage level, is switched off also. Therefore, the voltage level at the node A stays at the high voltage level without being decreased by all the third N-type MOSFET 230, the fifth N-type MOSFET 234, and the sixth N-type MOSFET 236. Similarly, since the fourth N-type MOSFET 232, the gate of which stays at the high voltage level of the node A, is switched on, and since the eighth N-type MOSFET 240, the gate of which stays at a high voltage level of the node AAA, is switched on also, a discharging path is generated on the fourth N-type MOSFET 232, whereas another discharging path is generated on both the seventh N-type MOSFET 238 and the eighth N-type MOSFET 240, and the voltage level at the node B is thus decreased more rapidly. Note that when the third N-type MOSFET 230 is included in the second stage voltage level shifting circuit 204, the decrease of the voltage level at the node A may still be sped up well without the existences of both the fifth N-type MOSFET 234 and the sixth N-type MOSFET 236. Similarly, when both the fifth N-type MOSFET 234 and the sixth N-type MOSFET 236 are included in the second stage voltage level shifting circuit 204, the decrease of the voltage level at the node A may also be sped up well without the existence of the aid of the third N-type MOSFET 230. Similarly again, when the fourth N-type MOSFET 232 is included in the second stage voltage level shifting circuit 204, the decrease of the voltage level at the node B may also be sped up well without the existences both the seventh N-type MOSFET 238 and the eighth N-type MOSFET 240, and vice versa. In summary, all the third N-type MOSFET 230, the fifth N-type MOSFET 234, the sixth N-type MOSFET 236, the fourth N-type MOSFET 232, the seventh N-type MOSFET 238, and the eighth N-type MOSFET 240 are capable of speeding up switches of the voltage levels of the output terminals of the second stage voltage level shifting circuit 204 in manners of discharging so that the two-stage voltage level shifting module 200 is able to rapidly and precisely switch the voltage levels at its output terminals according to the voltage level of the signal source Input.

Note that although the abovementioned descriptions are merely based on the circumstance that the signal source Input stays at a high voltage level, and since the second stage voltage level circuit 204 has a symmetrical circuitry, operations of the two-stage voltage level shifting module 200 when the voltage level of the signal source Input is low are also symmetrical with the operations when the voltage level of the signal source Input is high. Therefore, operations of the two-stage voltage level shifting module 200 when the voltage level of the signal source Input is low are not further described herein. Besides, the first stage voltage level shifting circuit 202 may also be implemented with other conventional voltage level shifting circuits capable of raising the upper bound of its voltage range. The voltage level shifting module 200 including the first stage voltage level shifting circuit 202 shown in FIG. 2 is merely a preferred embodiment of the present invention. Therefore, implementing the first stage voltage level shifting circuit 202 with other conventional voltage level shifting circuits capable of raising the upper bound of its voltage range should not be limitations to the present invention.

Following the abovementioned assumptions that the voltage level of the voltage source VDD1 is 1.0 volts, the voltage level of the voltage source VDD2 is 2.5 volts, and the voltage level of the voltage source VDDIO is 3.3 volts, and according to the two-stage voltage level shifting module 200 disclosed in FIG. 2, the voltage range of the signal source Input is between 0 volts and 1.0 volts, and the output voltage range of the two-stage voltage level shifting module 200 is between 1.0 volts and 3.3 volts. Considering an integrated circuit under the 0.18 µm fabrication procedures, a voltage difference equal to 2.3 volts does not lead to the gate oxide breakdown. Note that the voltage level shifting module 200 may still be applied on fabrication procedures of other sizes and external I/O devices having other voltage ranges, and related embodiments should not be limitations to the present invention as well.

In summary, the two-stage voltage level shifting module disclosed in the present invention raises an upper bound of its input voltage range with a first stage voltage level shifting circuit as an initialization, and then raises both the raised upper bound and a lower bound of the input voltage range with a second stage voltage level shifting circuit after the initialization is completed. Therefore, the drawback of generating the gate oxide breakdown of MOSFETs is neutralized, and digital signals including the digital logic 0 and the digital logic 1 may be precisely indicated. Besides, when the two-stage voltage level shifting module disclosed in the present invention is applied on external I/O devices having different biasing voltage ranges, required bias voltages may be easily provided for the external I/O devices with the aid of the two-stage voltage level shifting module disclosed in the present invention, which has the benefit of providing a broader and safer voltage range. The two-stage voltage level shifting module disclosed in the present invention utilizes a fewer amount of masks than the method of coupling two same voltage level shifting circuits in the prior art, therefore, the volume of the integrated circuit is prevented from being increased.

Those skilled in the art will readily observe that numerous modifications and alterations of the device and method may be made while retaining the teachings of the invention.

What is claimed is:

1. A two-stage voltage level shifting module for a plurality of I/O devices having different bias voltages, comprising:
    a first stage voltage level shifting circuit;
    a first voltage source coupled to a first voltage input terminal of the first stage voltage level shifting circuit;
    a second voltage source having an voltage level higher than the voltage level of the first voltage source and being coupled to a second voltage input terminal of the first stage voltage level shifting circuit;
    a third voltage source having an voltage level higher than the voltage levels of both the first voltage source and the second voltage source;
    a first P-type MOSFET (metal-oxide-semiconductor field-effect transistor) having a source coupled to the third voltage source;
    a second P-type MOSFET having a source coupled to the third voltage source, a drain coupled to a gate of the first P-type MOSFET, and a gate coupled to a drain of the first P-type MOSFET; and
    a second stage voltage level shifting circuit comprising:
        a third P-type MOSFET having a source coupled to the drain of the first P-type MOSFET;
        a fourth P-type MOSFET having a source coupled to the drain of the second P-type MOSFET;
        a fifth P-type MOSFET having a gate coupled to the drain of the third P-type MOSFET, a source coupled to the gate of the second P-type MOSFET, and a drain coupled to the first voltage source;
        a sixth P-type MOSFET having a gate coupled to the drain of the fourth P-type MOSFET, a source coupled to the gate of the first P-type MOSFET, and a drain coupled to the first voltage source;
        a first N-type MOSFET having a source coupled to the drain of the fifth P-type MOSFET, a gate coupled to a first signal output terminal of the first stage voltage level shifting circuit, and a drain coupled to the gate of the third P-type MOSFET;
        a second N-type MOSFET having a source coupled to the drain of the sixth P-type MOSFET, a gate coupled to a second signal output terminal of the first stage voltage shifting circuit, and a drain coupled to the gate of the fourth P-type MOSFET;
        a seventh P-type MOSFET having a gate coupled to the gate of the first N-type MOSFET, a drain coupled to the drain of the first N-type MOSFET, and a source coupled to the second voltage source; and
        an eighth P-type MOSFET having a gate coupled to the second N-type MOSFET, a drain coupled to the drain of the second N-type MOSFET, and a source coupled to the second voltage source.

2. The two-stage level shifting module of claim 1 further comprising:
    a third N-type MOSFET having a drain coupled to the drain of the third P-type MOSFET, and a gate coupled to the second voltage source; and
    a fourth N-type MOSFET having a drain coupled to the drain of the fourth P-type MOSFET, and a gate coupled to the third N-type MOSFET.

3. The two-stage voltage level shifting module of claim 1 further comprising:
    a third N-type MOSFET having a gate coupled to the drain of the second P-type MOSFET, a source coupled to the drain of the fifth P-type MOSFET, and a drain coupled to the gate of the second P-type MOSFET; and
    a fourth N-type MOSFET having a gate coupled to the drain of the first P-type MOSFET, a source coupled to the drain of the sixth P-type MOSFET, and a drain coupled to the gate of the first P-type MOSFET.

4. The two-stage voltage level shifting module of claim 1 further comprising:
    a third N-type MOSFET having a gate coupled to the second voltage source, and a drain coupled to the gate of the second P-type MOSFET;
    a fourth N-type MOSFET having a drain coupled to the source of the third N-type MOSFET, a gate coupled to the second signal output terminal of the first stage voltage level shifting circuit, and a source coupled to the drain of the fifth P-type MOSFET;
    a fifth N-type MOSFET having a drain coupled to the gate of the first P-type MOSFET, and a gate coupled to the second voltage source; and
    an sixth N-type MOSFET having a drain coupled to the source of the fifth N-type MOSFET, a gate coupled to the first signal output terminal of the first stage voltage level shifting circuit, and a source coupled to the drain of the sixth P-type MOSFET.

5. The two-stage voltage level shifting module of claim 1 further comprising:
    a third N-type MOSFET having a gate coupled to the drain of the second P-type MOSFET, a source coupled to the drain of the fifth P-type MOSFET, and a drain coupled to the gate of the second P-type MOSFET;
    a fourth N-type MOSFET having a gate coupled to the drain of the first P-type MOSFET, a source coupled to the drain of the sixth P-type MOSFET, and a drain coupled to the gate of the first P-type MOSFET;
    a fifth N-type MOSFET having a gate coupled to the second voltage source, and a drain coupled to the gate of the second P-type MOSFET;
    an sixth N-type MOSFET having a drain coupled to the source of the seventh N-type MOSFET, a gate coupled to the second signal output terminal of the first stage voltage level shifting circuit, and a source coupled to the drain of the fifth P-type MOSFET;

a seventh N-type MOSFET having a drain coupled to the gate of the first P-type MOSFET, and a gate coupled to the second voltage source; and an eighth N-type MOSFET having a drain coupled to the source of the seventh N-type MOSFET, a gate coupled to the first signal output terminal of the first stage voltage level shifting circuit, and a source coupled to the drain of the sixth P-type MOSFET.

6. The two-stage voltage level shifting module of claim 1 wherein the first stage voltage level shifting circuit comprises:

an invert logical operational amplifier having a first voltage input terminal coupled to the first voltage source, and a second voltage input terminal coupled to ground;

a third N-type MOSFET having a gate coupled to a signal output terminal of the invert logical operational amplifier, a source coupled to ground, and a drain coupled to the first signal output terminal of the first stage voltage level shifting circuit;

a fourth N-type MOSFET having a gate coupled to the signal input terminal of the invert logical operational amplifier, a source coupled to ground, and a drain coupled to the second signal output terminal of the first stage voltage level shifting circuit;

a seventh P-type MOSFET having a source coupled to the second voltage source, a gate coupled to the drain of the fourth N-type MOSFET, and a drain coupled to the drain of the third N-type MOSFET; and an eighth P-type MOSFET having a source coupled to the second voltage source, a gate coupled to the drain of the third N-type MOSFET, and a drain coupled to the drain of the fourth N-type MOSFET.

7. The two-stage voltage level shifting module of claim 6 further comprising:

a fifth N-type MOSFET having a source coupled to the source of the third N-type MOSFET, and a gate coupled to the second signal output terminal of the first stage voltage level shifting circuit; and an sixth N-type MOSFET having a source coupled to the source of the sixth N-type MOSFET, and a gate coupled to the first signal output terminal of the first stage voltage level shifting circuit.

8. The two-stage voltage level shifting module of claim 2 wherein the first stage voltage level shifting circuit comprises:

an invert logical operational amplifier having a first voltage input terminal coupled to the first voltage source, and a second voltage input terminal coupled to ground;

a fifth N-type MOSFET having a gate coupled to an output terminal of the invert logical operational amplifier, a source coupled to ground, and a drain coupled to the first signal output terminal of the first stage voltage level shifting circuit;

a sixth N-type MOSFET having a gate coupled to an input terminal of the invert logical operational amplifier, a source coupled to ground, and a drain coupled to the second signal output terminal of the first stage voltage level shifting circuit;

a seventh P-type MOSFET having a source coupled to the second voltage source, a gate coupled to the drain of the fifth N-type MOSFET, and a drain coupled to the drain of the sixth N-type MOSFET; and an eighth p-type MOSFET having a source coupled to the second voltage source, a gate coupled to the drain of the fifth N-type MOSFET, and a drain coupled to the drain of the sixth N-type MOSFET.

9. The two-stage voltage level shifting module of claim 8 further comprising:

a seventh N-type MOSFET having a source coupled to the source of the fifth N-type MOSFET, a gate coupled to the second signal output terminal of the first stage voltage level shifting circuit, and a drain coupled to the source of the third N-type MOSFET; and an eighth N-type MOSFET having a source coupled to the source of the sixth N-type MOSFET, a gate coupled to the first signal output terminal of the first stage voltage level shifting circuit, and a drain coupled to the source of the fourth N-type MOSFET.

* * * * *